(12) United States Patent
Shibano et al.

(10) Patent No.: US 9,472,430 B2
(45) Date of Patent: Oct. 18, 2016

(54) SUBSTRATE STORAGE CONTAINER AND EXPOSURE APPARATUS

(71) Applicant: KABUSHIKI KAISHA TOSHIBA, Minato-ku (JP)

(72) Inventors: Kohei Shibano, Mie (JP); Osamu Tanaka, Mie (JP); Keigo Toriumi, Aichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 542 days.

(21) Appl. No.: 13/961,177

(22) Filed: Aug. 7, 2013

(65) Prior Publication Data

US 2014/0223757 A1    Aug. 14, 2014

(30) Foreign Application Priority Data

Feb. 14, 2013   (JP) .................................. 2013-026910

(51) Int. Cl.
| | |
|---|---|
| F26B 25/06 | (2006.01) |
| H01L 21/677 | (2006.01) |
| H01L 21/673 | (2006.01) |

(52) U.S. Cl.
CPC ......... H01L 21/67359 (2013.01); F26B 25/06 (2013.01); H01L 21/67393 (2013.01)

(58) Field of Classification Search
CPC .. F26B 25/06; F26B 25/14; H01L 21/67359; H01L 21/67393
See application file for complete search history.

(56) References Cited

U.S. PATENT DOCUMENTS

| | | | |
|---|---|---|---|
| 6,184,970 B1* | 2/2001 | Nakahara | G03F 1/66 355/53 |
| 7,453,549 B2 | 11/2008 | Suzuki et al. | |
| 8,339,571 B2 | 12/2012 | Sewell et al. | |
| 2005/0286029 A1* | 12/2005 | Ham | G03F 7/70741 355/30 |

FOREIGN PATENT DOCUMENTS

| | | |
|---|---|---|
| JP | 2006-41499 A | 2/2006 |
| JP | 2006245375 A * | 9/2006 |
| JP | 2009-147334 | 7/2009 |
| JP | 2009-302185 | 12/2009 |
| JP | 2011-124591 | 6/2011 |
| JP | 2012-255958 | 12/2012 |
| WO | WO 99/60625 A1 | 11/1999 |
| WO | WO 02/21583 A1 | 3/2002 |

OTHER PUBLICATIONS

Office Action issued Apr. 28, 2015 in Japanese Patent Application No. 2013-026910 (with English language translation).
Office Action issued on Dec. 8, 2015 in Japanese Patent Application No. 2013-026910 with English translation.

* cited by examiner

*Primary Examiner* — Jiping Lu
(74) *Attorney, Agent, or Firm* — Oblon, McClelland, Maier & Neustadt, L.L.P.

(57) ABSTRACT

Provided is a reticle storage container including an inner container 10 which can store a plurality of reticles 16 and an outer container 1 which covers the inner container 10. The outer container 1 is configured to include a gas nozzle 5 which can inject a predetermined gas. The same gas as the gas supplied into an exposure apparatus 20 is supplied to the gas nozzle 5. The gas injected into the reticle storage container is vented through a vent hole 14 installed to the inner container 10.

11 Claims, 3 Drawing Sheets

SUBSTRATE STORAGE CONTAINER AND EXPOSURE APPARATUS

CROSS-REFERENCE TO RELATED APPLICATIONS

This application is based upon and claims the benefit of priority from Japanese Patent Application No. 2013-26910, filed on Feb. 14, 2013; the entire contents of which are incorporated herein by reference.

FIELD

Embodiments described herein relate generally to a storage container storing substrates for semiconductor device production such as reticles and an exposure apparatus including the storage container.

BACKGROUND

In the related art as a transport container for transporting masks (including reticles) in a hermetic state, a bottom open type transport container called an SMIF (standard mechanical interface) pod is known. In addition, an exposure apparatus where the SMIF pod is installed is used. In addition, an exposure apparatus configured to include a reticle library for storing reticles used for exposure of semiconductor devices inside the exposure apparatus is also known. However, in some cases of exposure apparatuses, a small number of reticles can be stored in the reticle library, and the number of reticles is insufficient for exposure of semiconductor devices.

DETAILED DESCRIPTION

According to embodiments, a reticle storage container is configured to include an inner container capable of storing a plurality of reticles. The reticle storage container is configured to include an outer container which covers the inner container. The outer container is configured to include a gas nozzle which allows a predetermined gas to be injected. The injected gas is vented through a vent hole installed in the inner container.

Hereinafter, a reticle storage container and an exposure apparatus according to the embodiments will be described in detail with reference to the attached drawings. The present invention is not limited to the embodiments.

Figure 1A:
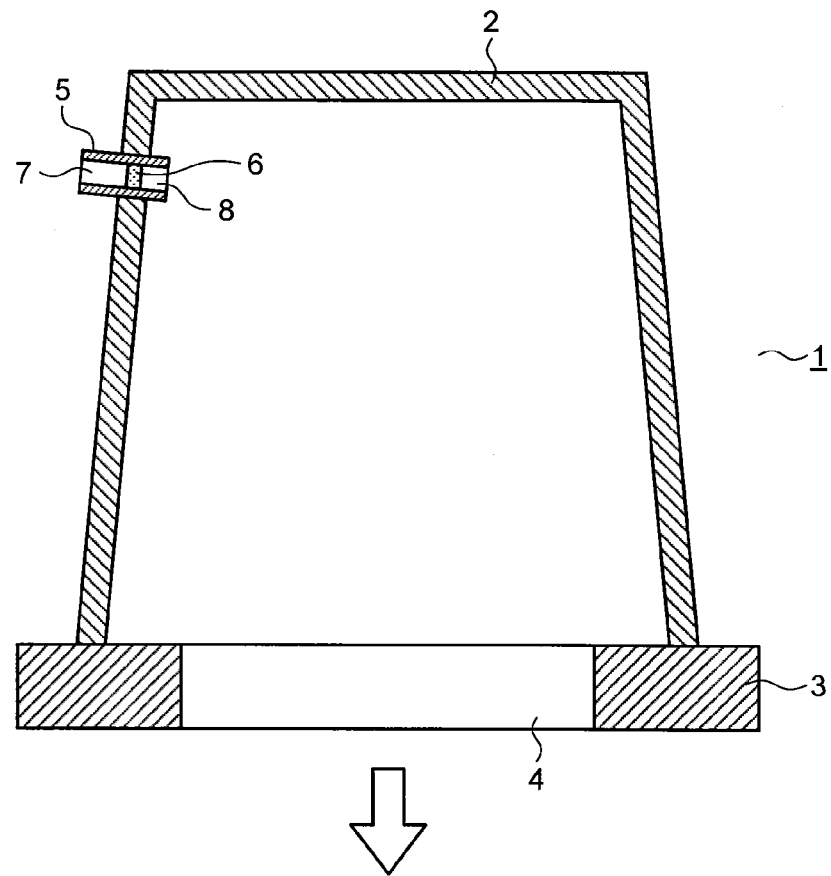
FIG. 1A is a schematic diagram illustrating an outer container of a reticle storage container according to a first embodiment.
Figure 1B:
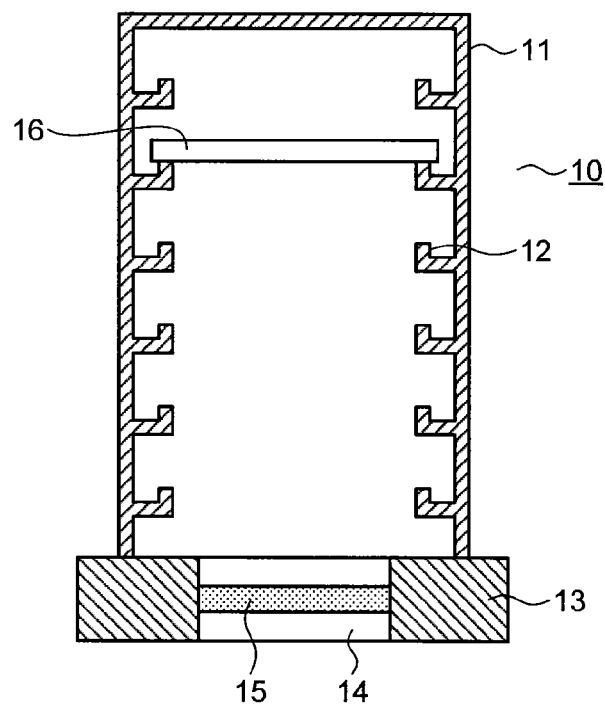
FIG. 1B is a schematic diagram illustrating an inner container of the reticle storage container according to the first embodiment.

FIGS. 1A and 1B are schematic diagrams illustrating a cross section of a reticle storage container according to a first embodiment. The reticle storage container according to the embodiment is configured to include an outer container 1 illustrated in FIG. 1A. The outer container 1 is configured to include an outer cover 2 and a bottom plate 3. A gas nozzle 5 is installed on an upper portion of a side of the outer cover 2. The gas nozzle 5 is configured to include an inlet port 7 and an outlet port 8. In the state where the gas nozzle 5 is installed in the exposure apparatus (not illustrated), the inlet port 7 of the gas nozzle 5 is connected to a predetermined gas supply pipe (not illustrated), and a predetermined gas is injected from the inlet port 7 into the inside of the outer cover 2 through the outlet port 8. A filter 6 is installed inside the gas nozzle 5. The filter 6 has, for example, a mesh structure to remove impurities mixed to the gas injected from the inlet port 7. As the filter, an HEPA (high efficiency particle air) filter or a ULPA (ultra low penetration) filter may be used. The bottom plate 3 is configured to include an insertion opening 4. The inner container 10 illustrated in FIG. 1B is inserted through the insertion opening 4, so that the outer circumference of the inner container 10 is covered by the outer container 1.

The reticle storage container according to the embodiment is configured to include the inner container 10 illustrated in FIG. 1B. The inner container 10 is configured to include a frame body 11 and a base 13 supporting the frame body 11. The frame body 11 has a frame structure where the frame body 11 is extended by a predetermined width in the forward/backward direction with respect to paper. Supporting shelves 12 having an L-shaped cross section are installed to both sides of the frame body 11. The supporting shelves 12 are extended in the forward/backward direction with respect to paper according to a width of the frame body 11. The reticles 16 are stored in the inner container 10 so that portions of both ends of each reticle are supported by a pair of supporting shelves 12. The number of stored reticles is defined according to the number of stages (the number of pairs) of supporting shelves 12. In the embodiment, six pairs of supporting shelves 12 are installed to the both sides of the frame body 11, so that six reticles can be stored. The state where one reticle 16 is stored is representatively illustrated. The frame body 11 has a structure so that forward and backward sides of the frame body 11 with respect to paper are opened. The stored reticles 16 are transported from the opened side of the frame body 11 into a chamber (not illustrated) of the exposure apparatus.

The base 13 has a vent hole 14, and a filter 15 is installed to the vent hole 14. As the filter 15, for example, an HEPA filter or a ULPA filter may be used. The inner container 10 is inserted from the insertion opening 4 of the bottom plate 3 of the outer container 1. The insertion opening 4 has dimensions according to a shape of the base 13 of the inner container 10, so that the bottom plate 3 of the outer container 1 and the base 13 of the inner container 10 are fitted to each other at the insertion opening 4. By fitting the outer container 1 and the inner container 10 to each other, a reticle storage container can have a structure where the outer container 1 covers the inner container 10. The gas injected from the gas nozzle 5 of the outer container 1 into the reticle storage container is vented from the vent hole 14 of the inner container 10. Although an exhaustion passage for releasing the gas vented from the vent hole 14 is installed in the base 13 of the inner container 10 and the bottom plate 3 of the outer container 1, the exhaustion passage is not illustrated. When the reticle storage container is placed on a mounting plate (not illustrated) of the exposure apparatus, the exhaustion passage becomes an exhaustion path of the gas which is injected into the reticle storage container and is vented from the vent hole 14.

Since the outer container 1 and the inner container 10 are fitted into each other, the inside of the reticle storage container is in a hermetic state where external air is blocked, so that the reticle storage container storing the reticles 16 can be used for transportation of the reticles 16. In the state where the reticle storage container is installed in the exposure apparatus (not illustrated), a predetermined gas is supplied from the gas nozzle 5 installed in the outer container 1 into the reticle storage container. The reticle 16 is deteriorated due to moisture. Therefore, as the gas supplied from the gas nozzle 5, for example, a dried air where moisture, organic materials, and inorganic materials are removed is used. Due to injection of the dried air, the reticles 16 can be stored in the reticle storage container for a long time, so that the reticle storage container can be used as a reticle library. Therefore, the reticle storage capacity (the number of stored reticles) of the reticle library (not illustrated) installed in the exposure apparatus (not illustrated) can be complemented. The number of reticles required for exposure can be prepared, so that the throughput of semiconductor device production can be improved. The gas nozzle 5 may be installed to a portion other than the side of the outer cover 2, for example, a portion of the upper surface of the outer cover 2.

Figure 2:
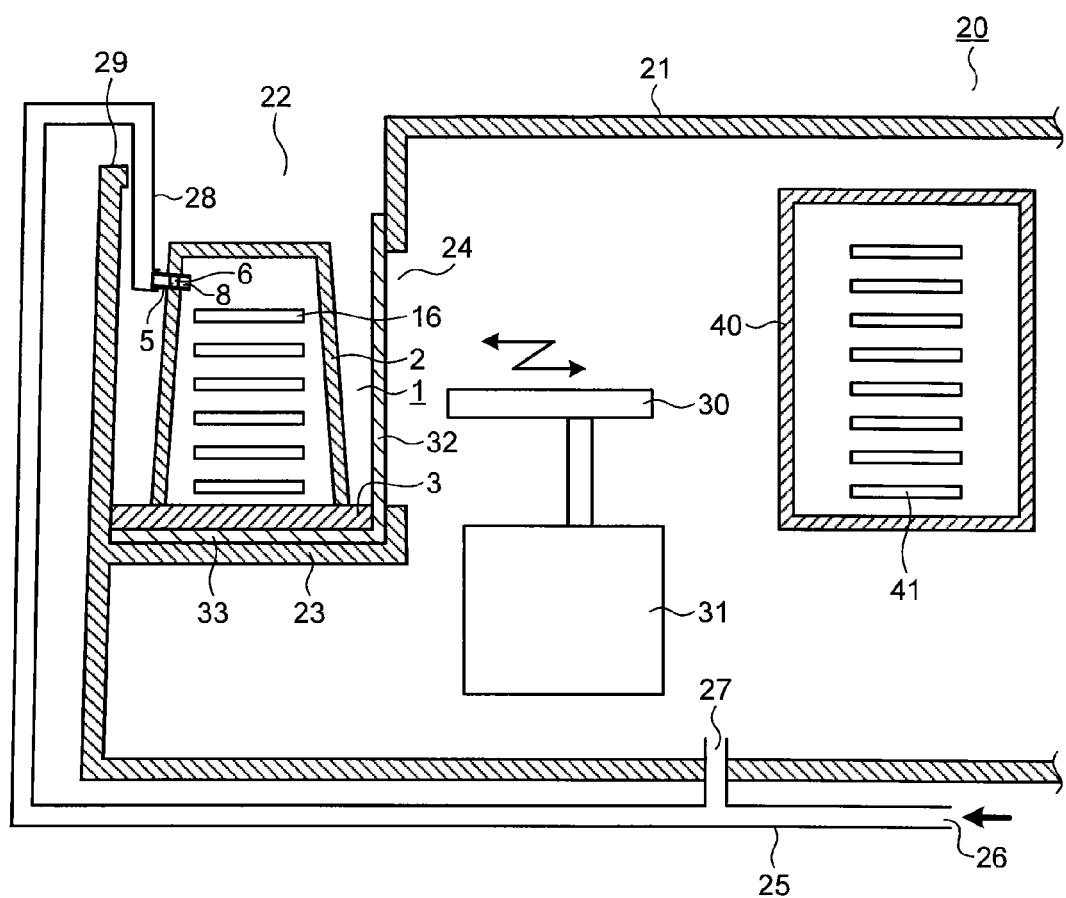
FIG. 2 is a schematic diagram illustrating an exposure apparatus according to a second embodiment, including a reticle storage container according to the first embodiment.

FIG. 2 is a schematic diagram illustrating an exposure apparatus 20 according to a second embodiment, including a reticle storage container according to the first embodiment. The exposure apparatus 20 according to the embodiment is configured to include a main body chamber 21. A mounting plate 23 for the reticle storage container is installed in the main body chamber 21. A composite member having a door unit 32 and a reticle storage container mounting unit 33 is installed in the mounting plate 23, and the reticle storage container configured to include the outer container 1 and the inner container 10 is mounted on the reticle storage container mounting unit 33. Although the reticle storage container where the outer container 1 and the inner container (not illustrated) are fitted to each other is mounted on the reticle storage container mounting unit 33 of the mounting plate 23, the outer cover 2 of the outer container 1, reticles 16 stored in the outer container 1, and the bottom plate 3 of the outer container 1 are schematically illustrated. The inner container 10 which supports the reticles 16 stored in the reticle storage container is not illustrated.

An opening frame unit 29 having an opening 22 according to dimensions of the outer cover 2 of the outer container 1 is installed to the main body chamber 21 disposed above the mounting plate 23. The main body chamber 21 has a reticle loading window 24. The reticle loading window 24 is used as a loading opening when the reticles 16 stored in the reticle storage container are to be loaded into the exposure apparatus. A reticle handler 30 and a driving unit 31 for the reticle handler 30 are installed inside the exposure apparatus 20 of the main body chamber 21. A reticle library 40 is installed inside the exposure apparatus 20. Reticles 41 used for exposure are stored in the reticle library 40.

The exposure apparatus 20 is configured to include a gas supply pipe 25 having a gas inlet port 26. The gas supply pipe 25 has an outlet port 27 for releasing a predetermined gas into the exposure apparatus 20. A front end portion 28 of the gas supply pipe branched from the gas supply pipe 25 is connected to the gas nozzle 5 installed to the outer container 1 of the reticle storage container. As the gas supplied through the gas supply pipe 25, a predetermined inert gas or a dried air where moisture, organic materials, and inorganic materials are removed is used. Due to the gas, the inside of the exposure apparatus 20 can be maintained clean. By allowing the gas supplied to the gas supply pipe 25 to be supplied to the reticle storage container, the inside of the reticle storage container can be maintained clean similarly to the inside of the exposure apparatus 20. When the inner container of the reticle storage container is covered with the outer container 1 and the reticle storage container is mounted on the mounting plate 23, the reticle loading window 24 is closed by the door unit 32 of the composite member.

By allowing the gas supplied to the inside of the exposure apparatus 20 to be supplied to the reticle storage container, the reticles 16 can be stored for a long time. In the case where the storage capacity (the number of stored reticles) of the reticle library 40 for reticle storage installed in the exposure apparatus 20 is small, the reticle storage container can be used for complementing the reticle library 40 of the exposure apparatus. By increasing the number of reticles installed in the exposure apparatus 20, the reticles necessary for semiconductor device production can be installed in the exposure apparatus 20, so that the throughput of the semiconductor device production can be improved. In addition, since the reticle storage container mounted in the exposure apparatus 20 is used as a reticle library, it is possible to increase the number of reticles installed in the exposure apparatus 20 at low costs.

Figure 3:
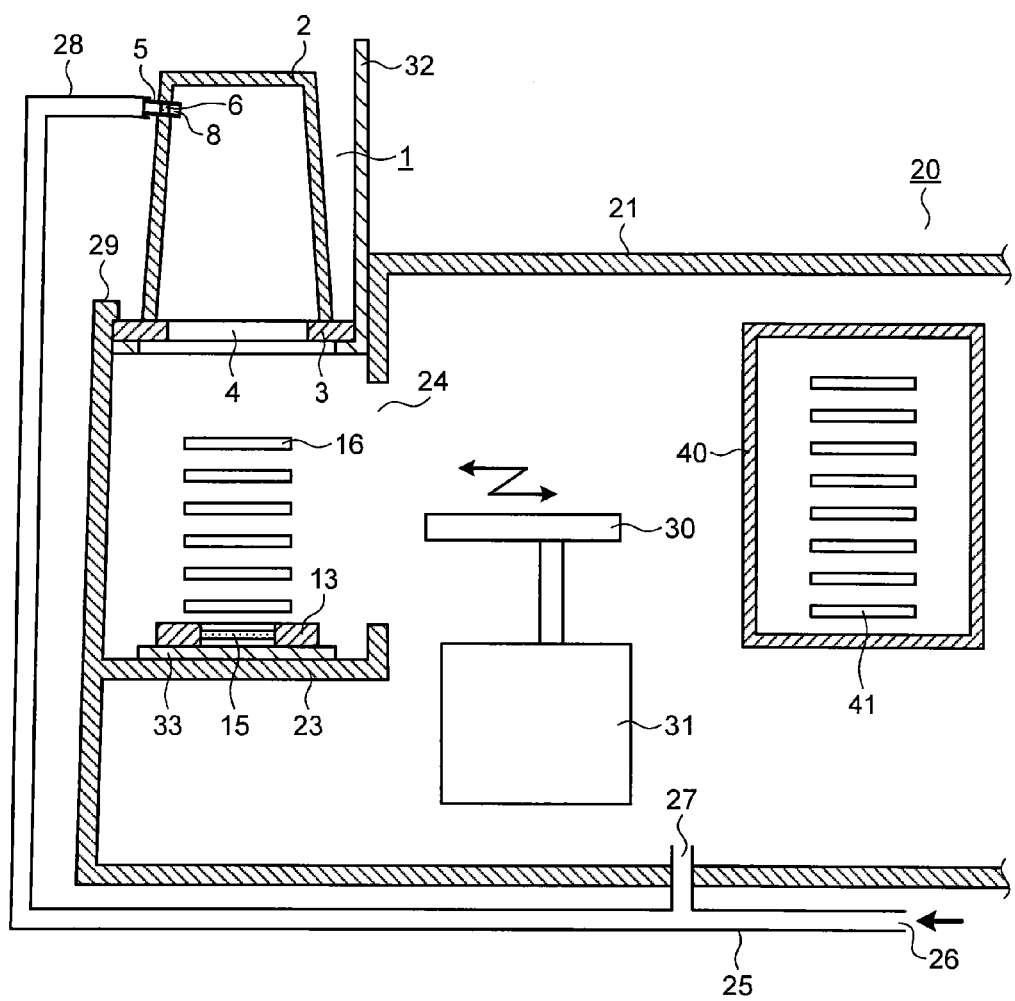
FIG. 3 is a schematic diagram illustrating a configuration in the case where reticles are transported from a reticle storage container into a chamber.

FIG. 3 is a schematic diagram illustrating a configuration in the case where the reticles 16 are loaded from the reticle storage container into the exposure apparatus 20. The components corresponding to the components illustrated in FIG. 2 are denoted by the same reference numerals, and the description thereof is not provided. In order to load the reticles 16 stored in the reticle storage container into the exposure apparatus 20, the outer cover 2 of the outer container 1 and the door unit 32 of the composite member are lifted up by a lifting mechanism (not illustrated) until the upper surface of the bottom plate 3 of the outer container 1 is in contact with the lower surface of the opening frame unit 29. Since the outer cover 2 of the reticle storage container is removed, the reticles 16 can be loaded into the exposure apparatus 20 by the reticle handler 30. Although the reticles 16 are supported by the inner container of the reticle storage container on the reticle storage container mounting unit 33 of the mounting plate 23, the frame body and the supporting shelves supporting the reticles 16 are not illustrated. A portion of the gas supply pipe 25 is configured, for example, with a cable-shaped structure (not illustrated) to secure a marginal length. Therefore, when the outer cover 2 of the reticle storage container is lifted up, the front end portion 28 of the gas supply pipe 25 can be lifted up accordingly.

A plurality of the reticle storage containers may also be configured to be mounted in the exposure apparatus 20. Accordingly, it is possible to further increase the number of reticles loaded in the exposure apparatus 20. In this case, the same gas may be supplied to the reticle storage containers, or different gases may be supplied to the reticle storage containers. The gas may be selected according to characteristics of the reticles stored in the reticle storage container. In addition, although the same gas as the gas supplied to the inside of the exposure apparatus 20 may be supplied, a separately prepared gas may be supplied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus comprising:
a chamber;
a mounting plate that is installed in the chamber and allows a reticle storage container to be mounted thereon, wherein the reticle storage container:
an inner container that stores a plurality of reticles; and
an outer container that covers the inner container and is configured to include a gas nozzle configured to inject a predetermined gas into an inside of the outer container;
a reticle loading window that is provided adjacent to the mounting plate so that one of the reticles is able to be moved from the reticle storage container to be carried into the chamber when the reticle storage container that is storing the reticles is mounted on the mounting plate;
a composite member including:
a door unit that closes the reticle loading window when the outer container of the reticle storage container is mounted on the mounting plate; and
a mounting unit that is installed on the mounting plate and on which the inner container of the reticle storage container is mounted; and
a lifting mechanism that together lifts up the door unit of the composite member and the outer container of the reticle storage container up to a predetermined position in a state where the mounting unit of the composite member remains on the mounting plate when the one reticle is carried into the chamber from the reticle storage container.

2. The exposure apparatus according to claim 1, wherein the inner container includes;
a base;
a frame body attached to the base; and
a plurality of supporting shelves which are installed to the frame body to support the reticles.

3. The exposure apparatus according to claim 2, wherein the base of the inner container has a vent hole having a filter.

4. The exposure apparatus according to claim 1, further comprising, in the chamber;
a reticle library that can store a plurality of reticles; and
a reticle handler that can load the reticles from the reticle storage container into the chamber.

5. The exposure apparatus according to claim 4, wherein a front end portion of a gas supply pipe which is branched from the gas supply pipe which supplies the predetermined gas into the chamber is connected to the gas nozzle of the outer container of the reticle storage container.

6. An exposure apparatus where a reticle storage container is installed,
the reticle storage container including:
an inner container; and
an outer container that covers the inner container and is configured to include a gas nozzle configured to inject a predetermined gas into an inside of the outer container,
the inner container including:
a base having a vent hole where a filter is installed;
a frame body attached to the base; and
a plurality of supporting shelves which are installed to the frame body to support reticles,
the exposure apparatus comprising:
mounting plate that is installed in a chamber of the exposure apparatus and allows the reticle storage container to be mounted thereon;
a reticle loading window that is provided adjacent to the mounting plate so that one of the reticles is able to be moved from the reticle storage container to be carried into the chamber when the reticle storage container that is storing the reticles is mounted on the mounting plate;
a composite member including:
a door unit that closes the reticle loading window when the outer container of the reticle storage container is mounted on the mounting plate; and
a mounting unit that is installed on the mounting plate and on which the inner container of the reticle storage container is mounted; and
a lifting mechanism that together lifts up the door unit of the composite member and the outer container of the reticle storage container up to a predetermined position in a state where the mounting unit of the composite member remains on the mounting plate when the one reticle is carried into the chamber from the reticle storage container.

7. The exposure apparatus according to claim 6, wherein the exposure apparatus is configured to include the chamber to which a predetermined gas is supplied, and the predetermined gas is supplied to the gas nozzle of the outer container of the reticle storage container.

8. The exposure apparatus according to claim 7, further comprising, in the chamber;
a reticle library that can store a plurality of reticles; and
a reticle handler that can load the reticles from the reticle storage container into the chamber.

9. The exposure apparatus according to claim 8, wherein a front end portion of a gas supply pipe which is branched from the gas supply pipe which supplies the predetermined gas into the chamber is connected to the gas nozzle of the outer container of the reticle storage container.

10. The exposure apparatus according to claim 6, wherein the exposure apparatus is configured to include the chamber to which a predetermined gas is supplied, and a gas different from the predetermined gas is supplied to the gas nozzle of the outer container of the reticle storage container.

11. The exposure apparatus according to claim 10, further comprising, in the chamber;
a reticle library which can store a plurality of reticles; and
a reticle handler which can load the reticles from the reticle storage container into the chamber.

* * * * *